United States Patent
Chang et al.

(10) Patent No.: US 11,382,237 B1
(45) Date of Patent: Jul. 5, 2022

(54) CHASSIS POWER SUPPLY RECEPTION

(71) Applicant: QUANTA COMPUTER INC., Taoyuan (TW)

(72) Inventors: Chun Chang, Taoyuan (TW); Shih-Hsuan Hu, Taoyuan (TW); Wei-Cheng Tseng, Taoyuan (TW); Cheng-Feng Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 44 days.

(21) Appl. No.: 17/136,415

(22) Filed: Dec. 29, 2020

(51) Int. Cl.
*H05K 7/20* (2006.01)

(52) U.S. Cl.
CPC ..... *H05K 7/20145* (2013.01); *H05K 7/20172* (2013.01); *H05K 7/20736* (2013.01)

(58) Field of Classification Search
CPC ........... H05K 7/20145; H05K 7/20172; H05K 7/20736; H05K 7/20618
USPC ............................................ 361/679.51, 786
See application file for complete search history.

(56) References Cited

U.S. PATENT DOCUMENTS

| | | | | |
|---|---|---|---|---|
| 8,743,549 B2 * | 6/2014 | Frink | ...................... | G06F 1/206 361/679.5 |
| 10,026,454 B2 * | 7/2018 | Davis | ................... | G11B 33/128 |
| 10,624,241 B1 * | 4/2020 | Ross | ................... | H05K 7/20736 |
| 11,172,588 B1 * | 11/2021 | Yang | ..................... | H05K 7/1424 |
| 2009/0147452 A1 * | 6/2009 | Zhang | ..................... | G06F 1/181 361/679.02 |
| 2013/0288494 A1 * | 10/2013 | Cowles | ................ | H05K 7/1455 439/133 |
| 2014/0003010 A1 * | 1/2014 | Lee | ...................... | H05K 7/1485 361/759 |
| 2014/0281224 A1 * | 9/2014 | Frink | ................... | H05K 7/1457 711/114 |
| 2017/0300100 A1 * | 10/2017 | Takeuchi | ................ | G06F 1/266 |
| 2019/0074667 A1 * | 3/2019 | Huang | ...................... | H02J 3/06 |
| 2021/0235598 A1 * | 7/2021 | Caldwell | .................. | H05K 5/03 |

* cited by examiner

Primary Examiner — Stephen S Sul
(74) Attorney, Agent, or Firm — Nixon Peabody LLP

(57) ABSTRACT

A computer chassis can include an airflow channel for permitting airflow specifically to cool one or more power supply units (PSUs) within respective power supply receiving space(s). The chassis can include a baffle device positioned between the power supply receiving space and the airflow channel for directing airflow through the PSU into the airflow channel. The airflow channel can be located between first and second spaces of the chassis, each containing computing components. The baffle device can include a cable passthrough that receives a cable that facilitates communication between component(s) in the first space and component(s) in the second space. The baffle device can include one or more ribs that stop the PSU from being fully inserted into the power supply receiving space when the PSU is inserted in an incorrect orientation, thus signaling to the user to remove the PSU and re-insert it in a correct orientation.

20 Claims, 7 Drawing Sheets

CHASSIS POWER SUPPLY RECEPTION

TECHNICAL FIELD

The present disclosure relates to computer systems generally and more specifically to power supplies for computer chassis.

BACKGROUND

Computing systems, such as rack-mounted servers, are used across many fields, with increasingly demanding specifications. As the demands increase for more powerful and faster systems, there are also demands for maintaining or decreasing a system's footprint. In certain chassis, such as 1-unit (1U) or 2-unit (2U) chassis, the use of high-wattage power supplies can require significant thermal management. In some cases, thermal management can be especially complicated when there is a need for routing cables around within the chassis. Additionally, assembly and maintenance of computer systems can become complicated as the complexity of the internal parts increases.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a baffle device for use in a computer system. The baffle device can comprise a baffle body having a first leg and a second leg connected by a cross-member. The cross-member can extend from a first end of the baffle body to a second end of the baffle body. The baffle device can include an airflow space defined by the first leg, the second leg, and the cross-member. The airflow space can be sized to receive a receiving connector. The receiving connector can receive a corresponding connector of a power supply unit (PSU) when the PSU is moved in an insertion direction to a first insertion depth while the PSU is in a correct orientation. The baffle device can further include a cable passthrough located in the cross-member. The cable passthrough can receive a cable, and can extend between the first end of the baffle body and the second end of the baffle body. The baffle device can further include at least one rib extending from the baffle body. An impact surface of the at least one rib can be positioned to contact the connector of the PSU when the PSU is moved in an insertion direction to a second insertion depth while the PSU in an incorrect orientation. The first insertion depth is greater than the second insertion depth.

In some cases, the cable passthrough is perpendicular to the insertion direction. In some cases, the baffle device further comprises a compressible air seal removably positioned on an upper surface of the baffle body. In some cases, the compressible air seal covers the cable passthrough such that removal of the compressible air seal permits access to the cable passthrough. In some cases, the cross-member includes a baffle surface for directing airflow impacting the baffle surface towards the airflow space, wherein the at least one rib extends from the baffle surface. In some cases, the baffle body is shaped such that a plane defined by the impact surface of the at least one rib is positioned opposite the receiving connector from an exit of the airflow space. In some cases, the baffle body is configured to rest upon a power distribution board containing the receiving connector. In some cases, the at least one rib is positioned such that a distance between the receiving connector and a bottom surface of a board containing the receiving connector is equal to a distance between an upper surface of the baffle body and a point on the impact surface.

Embodiments of the present disclosure include a computer system comprising a chassis and a power supply receiving space located within the chassis. The power supply receiving space has a first end opposite a second end, where the first end has an opening for receiving a power supply unit (PSU). The computer system further includes a power distribution board position adjacent the second end of the power supply receiving space. The power distribution board has a receiving connector for receiving a corresponding connector of the PSU when the PSU is inserted into the power supply receiving space to a first insertion depth while the PSU is in a correct orientation. The computer system further includes an airflow channel positioned in the chassis between a first chassis space and a second chassis space. The computer system further includes a baffle device positioned between the power supply receiving space and the airflow channel. The baffle device includes a baffle surface for directing air passing through the power supply receiving space into the airflow channel. The baffle device further includes a cable passthrough located in the cross-member for receiving a cable. The cable passthrough extends between the first end of the baffle device and the second end of the baffle device. The baffle device has at least one rib extending from the baffle surface. The at least one rib is positioned to contact the connector of the PSU when the PSU is inserted into the power supply receiving space to a second insertion depth while the PSU is in an incorrect orientation. The first insertion depth is greater than the second insertion depth.

In some cases, the cable facilitates electrically coupling a first component in the first space to a second component in the second space. In some cases, the cable couples to a data connector of the power distribution board. In some cases, the cable passthrough is perpendicular to an insertion direction of the PSU when the PSU is inserted into the power supply receiving space. In some cases, the computer system further comprises a compressible air seal removably positioned on an upper surface of the baffle device. In some cases, the compressible air seal covers the cable passthrough such that removal of the compressible air seal permits access to the cable passthrough. In some cases, the baffle device is shaped such that the connector of the PSU contacts the at least one rib along a plane when the PSU is inserted in the incorrect orientation, wherein the plane is positioned opposite the receiving connector from the airflow channel. In some cases, the baffle device rests upon the power distribution board. In some cases, the at least one rib includes an impact surface for contacting the connector of the PSU. The at least one rib is positioned such that a distance between the receiving connector and a floor of the power supply receiving space is equal to a distance between a ceiling of the power supply receiving space and a point on the impact surface.

Embodiments of the present disclosure include a method comprising supplying a computer system. The computer system includes a chassis and a power supply receiving space located within the chassis. The computer system further includes a power distribution board position adjacent an internal end of the power supply receiving space. The power distribution board has a receiving connector. The computer system further includes an airflow channel positioned in the chassis between a first chassis space and a second chassis space. The computer system further includes a baffle device positioned between the power supply receiving space and the airflow channel. The baffle device includes a baffle surface for directing air passing through the power supply receiving space into the airflow channel. The baffle device further includes a cable passthrough located in the cross-member for receiving a cable. The cable passthrough extending between the first end of the baffle device and the second end of the baffle device. The baffle device further has at least one rib extending from the baffle surface. The method further includes inserting a power supply unit (PSU) into the power supply receiving space. The PSU has a connector positioned opposite an external face of the PSU. Insertion of the PSU in a correct orientation results in connection of the connector with the receiving connector when the PSU is inserted to a first insertion depth. Insertion of the PSU in an incorrect orientation results in contact between the connector and the at least one rib of the baffle device when the PSU is inserted to a second insertion depth. The first insertion depth is greater than the second insertion depth.

In some cases, the chassis includes a first space and a second space separated by the airflow channel. The computer system further includes a first component positioned in the first space and a second component positioned in the second space. The method further comprises supplying power to the PSU and operating the PSU. Operating the PSU comprises operating a fan associated with the PSU to pass air through the PSU, towards the baffle surface of the baffle device, and into the airflow channel. Operating the PSU further comprises supplying power to the first component and the second component. The method further comprises transferring data between the first component and the second component via the cable. In some cases, inserting the PSU includes fully inserting the PSU in the incorrect orientation, and the method further comprises identifying that the PSU is inserted in the incorrect orientation by identifying a distance between the chassis and a plane formed by the external face of the PSU.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
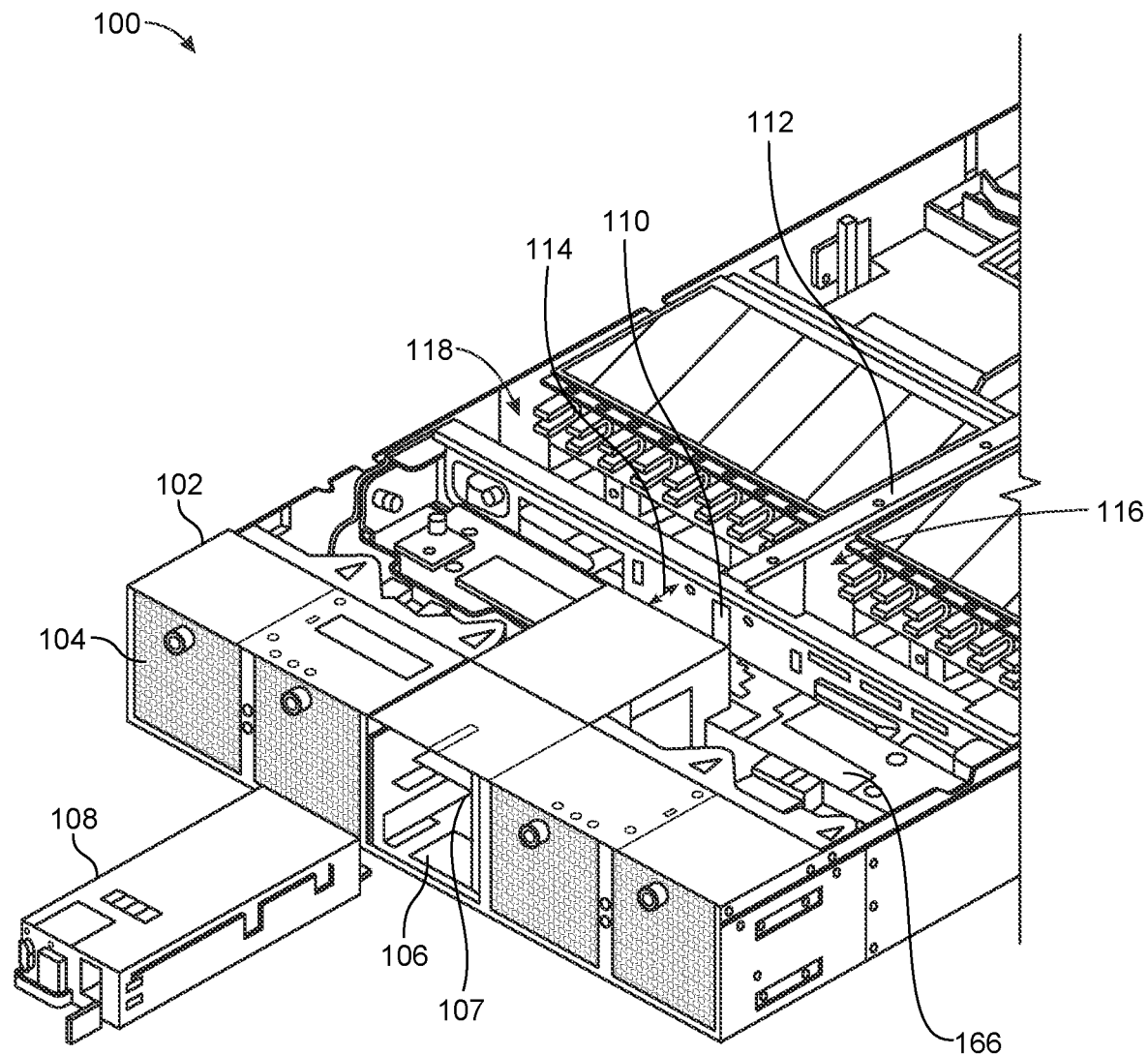
FIG. 1 is an isometric projection of a computer system with a power supply unit ready for insertion, according to certain aspects of the present disclosure.

Certain aspects and features of the present disclosure relate to a computer chassis that includes an airflow channel for permitting airflow specifically to cool one or more power supply units (PSUs) within respective power supply receiving space(s). The chassis can include a baffle device positioned between the power supply receiving space and the airflow channel for directing airflow through the PSU into the airflow channel. The airflow channel can be located between first and second spaces of the chassis, each containing computing components. The baffle device can include a cable passthrough that receives a cable that facilitates communication between component(s) in the first space and component(s) in the second space. The baffle device can include one or more ribs that stop the PSU from being fully inserted into the power supply receiving space when the PSU is inserted in an incorrect orientation, thus signaling to the user to remove the PSU and re-insert it in a correct orientation.

In certain computer systems, especially systems with demands for high-powered power supplies (e.g., PSUs having 800 W, 1300 W, and/or 2400 W or more), air flow used to cool the PSU must be well-managed. To achieve improved cooling efficiency, an airflow channel can be used to establish an airflow path into the PSU at a first end of a computer chassis, through the airflow channel, and out the second end of the chassis. Such an airflow channel can be a dedicated channel used specifically for PSU cooling. Thus, heated air from the PSU can exit the chassis without contacting other electronic components (e.g., motherboard, processing units, memory devices, and the like) in the computer chassis.

In some cases, the airflow channel is designed to have a small or minimal width, and thus must extend vertically within the chassis. In some cases, the airflow channel is optimally located centrally in the chassis or otherwise spaced apart form a sidewall of the chassis. The airflow channel can thus separate the chassis into multiple spaces, such as a first chassis space and a second chassis space. However, because of the presence of the airflow channel, it can be difficult to run cables between components in the first chassis space and components in the second chassis space without exiting the chassis.

For example, in some cases, a motherboard and a controller card (e.g., a redundant array of independent disks (RAID) card or a host bus adapter (HPA) card) can be located in a first chassis space, and a set of storage devices (e.g., hard drives or solid state drives) can be located in the second chassis space. To operate the storage devices at high speeds necessary in many computer system implementations, the storage devices are coupled to the controller card via high speed cables (e.g., serial attached SCSI (small computer system interface) (SAS) cables, serial ATA (advanced technology attachment) (SATA) cables, or high-density SAS or SCSI cables). Thus, sets of cables may need to pass between the first chassis space and the second chassis space.

Certain aspects and features of the present disclosure relate to a baffle device positioned between a power supply receiving space of the chassis and the airflow channel. The baffle device can direct air that is passing through the PSU (e.g., air passing through the power supply receiving space) into the airflow channel. The baffle device can include a baffle surface that is angled, curvilinear, or otherwise shaped to direct air into the airflow channel.

The baffle device can further include a cable passthrough that permits one or more cables to pass from one side of the baffle device through to the other. The cable passthrough can be formed in part by the baffle surface, such that the baffle surface rests between the cable passthrough and incoming air from the power supply receiving space. In some cases, the cable passthrough is formed as a trough in the top of the baffle device, thus permitting easy access to the cable passthrough. A compressible air seal can be placed on the upper surface of the baffle device to reduce or minimize the risk of air leak between the baffle device and any surface immediately above the baffle device (e.g., a top cover). In some cases, the compressible air seal can cover the cable passthrough, which can facilitate keeping any cables from escaping from the cable passthrough. In some cases, the compressible air seal comprises a sponge material. In some cases, the compressible air seal further includes a layer of biaxially-oriented polyethylene terephthalate (BoPET) (e.g., Mylar®) or a similar thin film material directly contacting the top surface of the baffle device, such as to improve the ability to remove the compressible air seal, which may be especially useful when access to the cable passthrough is desired.

In many cases, PSUs can be inserted into a power supply receiving space in at least two different orientations, including at least a correct orientation and an incorrect orientation. Often, the incorrect orientation is longitudinally rotated 180° from the correct orientation. When the PSU is inserted in the correct orientation, a connector of the PSU (e.g., an edge connector or a Golden Finger connector) can engage a receiving connector within the chassis. The receiving connector can be coupled to a power distribution board, such that power passing from the PSU to the various electronic components of the computer system passes through the receiving connector. When fully inserted in the correct orientation, the external face of the PSU is often flush with the chassis or the power supply receiving space.

In some cases, the baffle device can also include one or more ribs designed to contact the connector of the PSU if the PSU is inserted in the incorrect orientation. The one or more ribs can extend from the baffle surface and/or other surfaces of the baffle device. The one or more ribs can expose impact surface(s) towards the PSU, such that insertion of the PSU in the incorrect orientation causes the connector to contact the impact surface(s). The one or more ribs are configured such that the PSU cannot be inserted into the power supply receiving space beyond a particular insertion depth that is smaller than the insertion depth when the PSU is fully inserted in the correct orientation. Thus, when the PSU is fully inserted in the incorrect orientation, the external face of the PSU will not be flush with the chassis or power supply receiving space. Instead, the external face of the PSU will be spaced apart from the chassis or power supply receiving space. Thus, use of the disclosed baffle device can make it easy to visually distinguish a PSU inserted in a correct orientation from a PSU inserted in an incorrect orientation.

In some cases, the baffle device can be made of a single piece of material, although that need not always be the case. In some cases, the baffle surface and the one or more ribs can be formed together, although that need not always be the case.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

FIG. 1 is an isometric projection of a computer system 100 with a power supply unit (PSU) 108 ready for insertion, according to certain aspects of the present disclosure. Computer system 100 can include a chassis 102. Chassis 102 is depicted as a 2U chassis, although other size chassis can be used. Chassis 102 can include two power supply receiving spaces 106, 107 in a stacked arrangement, although other arrangements can be used (e.g., a side-by-side arrangement). In some cases, other numbers of power supply receiving spaces 106, 107 can be used (e.g., one space or more than two spaces). For purposes of description herein, the end of the chassis having the power supply receiving spaces 106, 107 will be referred to as a rear end of the chassis, although in some cases it can be known as a front end.

The chassis 102 can include a set of cooling fans 104, such as four cooling fans 104 depicted in FIG. 1, for cooling components of the computer system 100. In some cases, one or more cooling fans 104 will be positioned laterally on opposite sides of the power supply receiving spaces 106, 107.

PSU 108 is aligned for insertion in the upper power supply receiving space 107. When the PSU 108 is fully inserted into the upper power supply receiving space 107, it will make contact with a receiving connector on an upper power distribution board 166. Likewise, a PSU fully inserted into the lower power supply receiving space 106 will make contact with a receiving connector on a lower power distribution board located below the upper power distribution board 166. During use, a fan, such as a fan within the PSU 108, can induce airflow through the PSU 108 and through the upper power supply receiving space 107. This airflow can be directed into an airflow channel opening 110 and through an airflow channel 112. The airflow channel 112 can extend from the airflow channel opening 110 through the length of the chassis 102 to an opposite end (e.g., a front end) of the chassis.

For illustrative purposes, the air baffles used to direct airflow from the power supply receiving spaces 106, 107 to the airflow channel 112 is not depicted. Such air baffles would fit in air baffle space 114.

The airflow channel 112 can establish a separation between a first chassis space 116 and a second chassis space 118. As seen in FIG. 1, the airflow channel 112 and the power supply receiving spaces 106, 107 occupy most of the longitudinal length of the chassis 102. Thus, to pass physical cables laterally across the chassis 102 (e.g., between the first chassis space 116 and the second chassis space 118), such cables would pass at the air baffle space 114. Thus, the air baffle disclosed herein can include a cable passthrough to facilitate passing one or more cables laterally across the chassis 102.

Figure 2:
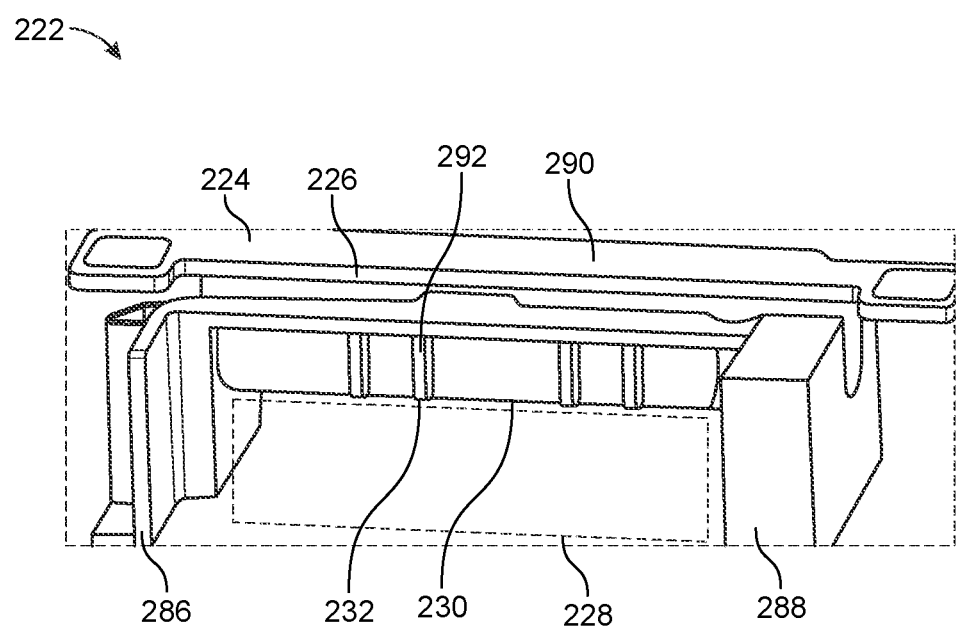
FIG. 2 is an axonometric projection of an air baffle, according to certain aspects of the present disclosure.

FIG. 2 is an axonometric projection of an air baffle 222, according to certain aspects of the present disclosure. Air baffle 222 can be used in a computer system, such as computer system 100 of FIG. 1. For example, air baffle 222 can be used in air baffle space 114 of FIG. 1.

The air baffle 222 can include a baffle surface 230 for directing airflow into an airflow space 228. In some cases, the airflow space 228 is defined by a first leg 286, a second leg 288, and a cross-member 290 coupling the first leg 286 and second leg 288 together. When installed, the receiving connector of the power distribution board may be located at least partially within the airflow space 228

A cable channel 226 can extend laterally across the air baffle 222, such as from a first end (e.g., a first end coinciding with the first leg 286) to a second end (e.g., a second end coinciding with the second leg 288). The cable channel 226 is open at the top surface 224 of the air baffle 222, although that need not always be the case. When open at the top surface 224, the cable channel 226 can be closed by placement of a covering, such as a compressible air seal, on the top surface 224.

One or more ribs (e.g., four ribs 232 as depicted in FIG. 2) can extend from the baffle surface 230. Each rib 232 can have an impact surface 292 that faces towards the PSU when the PSU is inserted in the power supply receiving space. When the PSU is inserted in an incorrect orientation, the connector of the PSU can contact the impact surface 292. The use of ribs 232 extending from the baffle surface 230 can efficiently stop the PSU from being inserted without using substantial amounts of material and by keeping airflow through the air baffle 222 efficient. In some cases, the impact surface 292 is a flat plane that is parallel to the end of the connector of the PSU (e.g., perpendicular the insertion direction of the PSU into the power supply receiving space).

Figure 3:
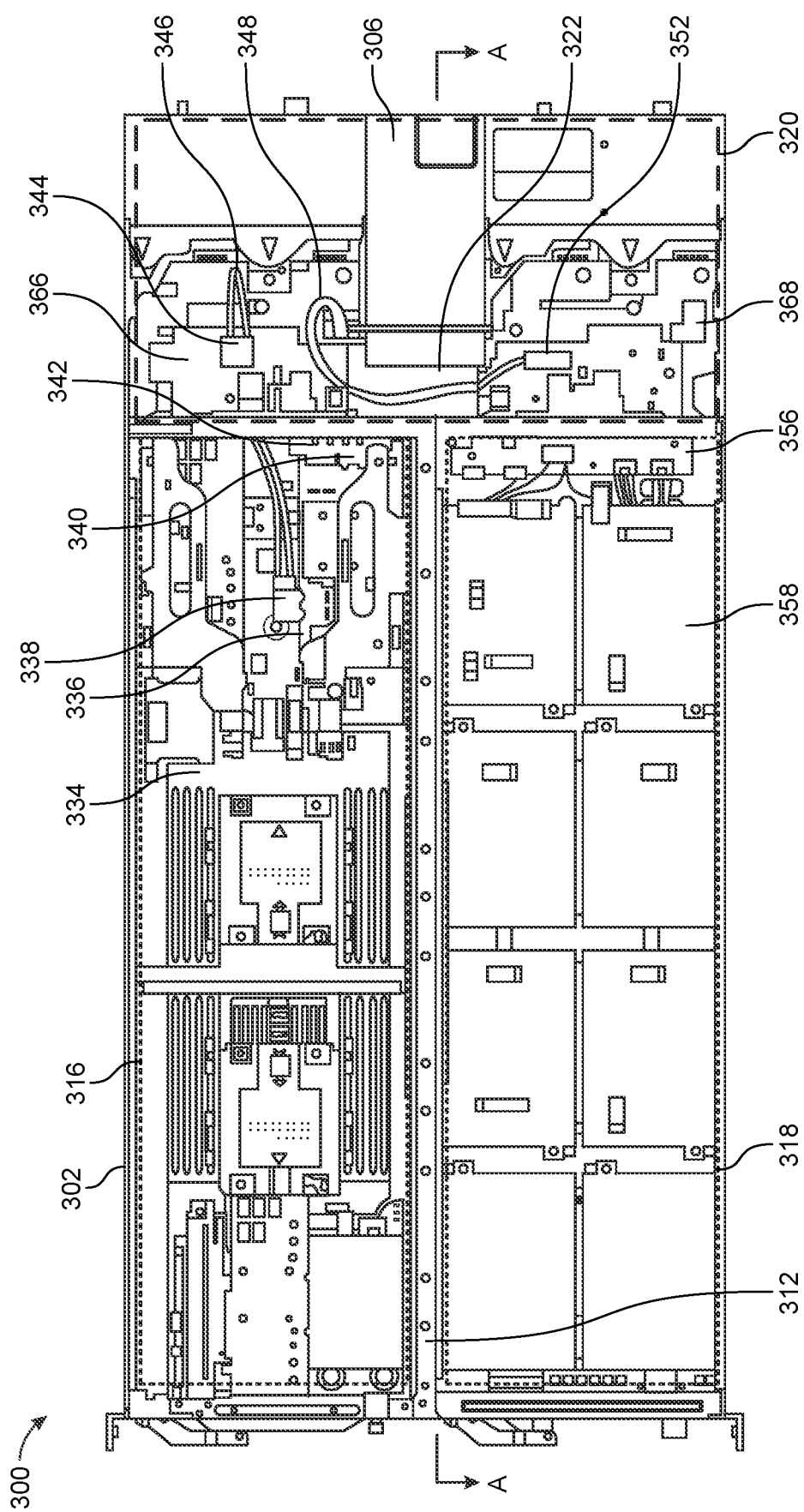
FIG. 3 is a top view of a computer system with air baffles, according to certain aspects of the present disclosure.

FIG. 3 is a top view of a computer system 300 with air baffles 322, according to certain aspects of the present disclosure. Computer system 300 can be any suitable computer system, such as computer system 100 of FIG. 1. Air baffles 322 can be any suitable air baffle, such as air baffle 222 of FIG. 2.

The computer system 300 includes a chassis 302. The chassis 302 can include a first chassis space 316 and a second chassis space 318 separated by an airflow channel 312. For illustrative purposes, the chassis 302 can further include a power distribution group 320.

The first chassis space 316 can include a motherboard 334. A controller board 336 (e.g., a RAID card or HPA card) can be coupled to the motherboard 334. The controller board 336 can include a first connector 338, a second connector 340, and a third connector 342. Examples of suitable connectors include data connectors, such as SATA connectors, SAS connectors, HD SATA connectors, or HD SAS connectors (e.g., Mini-SAS HD SFF8643 connectors). Any number of connectors can be used.

The second chassis space 318 can include a set of storage drives 358 (e.g., hard drives or solid state drives). As depicted in FIG. 3, eight stacks of three storage drives 358 are located in second chassis space 318 for a total of twenty-four storage drives 358, although any number can be used. One or more drive board 356 can be used to provide power and data connectivity to the set of storage drives 358.

The power distribution group 320 can include a lower power distribution board 368 located beneath an upper power distribution board 366, as well as a lower power supply receiving space positioned beneath an upper power supply receiving space 306. When in a correct orientation, a PSU fully inserted into the lower power supply receiving space or upper power supply receiving space 306 can couple with receiving connectors on the lower power distribution board 368 or upper power distribution board 366, respectively. Thus, power can be distributed from the PSUs to other electronic components of the computer system 300 via the power distribution boards 366, 368. In some cases, one of the power distribution boards 366, 368 serves as a redundant backup for the other of the power distribution boards 366, 368.

During use, air passing through the upper power supply receiving space 306 will be directed into the airflow channel 312 via upper baffle 322. Likewise, air passing through the lower power supply receiving space will be directed into the airflow channel 312 via a lower baffle.

To electronically couple the controller board 336 to the set of storage drives 358, multiple cables can be used. A first cable 346 is seen coupling the first connector 338 of the controller card 336 with connector 344 on the upper power distribution board 366. First cable 346 is shown passing between the lower power distribution board 368 and the upper power distribution board 366, although that need not always be the case.

A second cable 348 is seen coupling the second connector 340 with connector 352 of the upper power distribution board 366. Second cable passes through the cable passthrough of the upper baffle device 322.

A third cable, hidden from view by the upper power distribution board 366, couples the third connector 342 with a connector of the lower power distribution board 368. The third cable passes through the cable passthrough of the lower baffle device.

The upper power distribution board 366 and lower power distribution board 368 can include one or more additional connectors (e.g., connectors adjacent the second chassis space 318) for electrically coupling the connectors 344, 352 and the connector of the lower power distribution board 368 with the set of storage drives 358, such as via the one or more drive boards 356.

Figure 4:
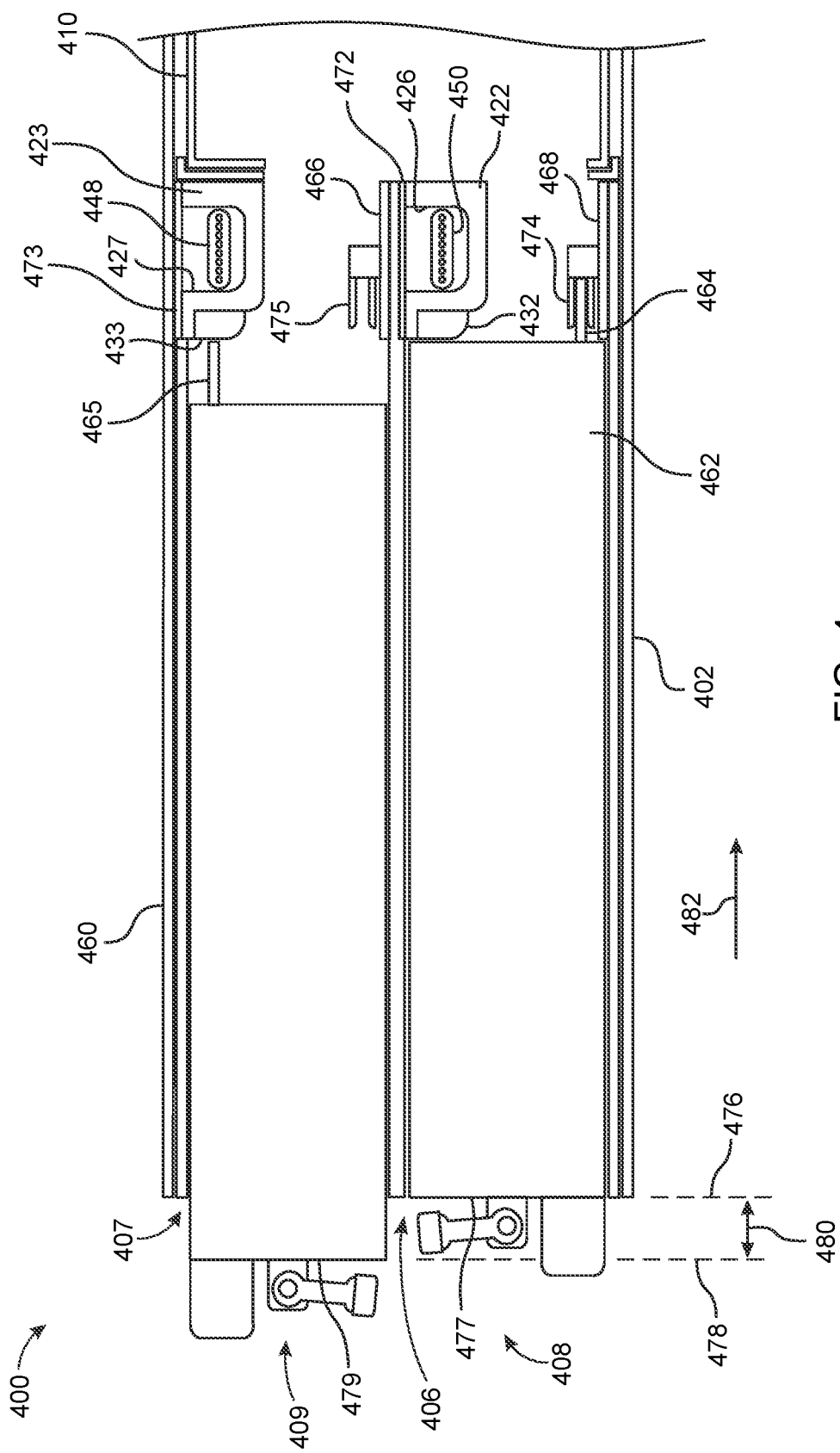
FIG. 4 is a side cross-sectional view of a computer system taken along line A:A of FIG. 3 with two power supply units inserted, according to certain aspects of the present disclosure.

FIG. 4 is a side cross-sectional view of a computer system 400 taken along line A:A of FIG. 3 with two power supply units 408, 409 inserted, according to certain aspects of the present disclosure. Computer system 400 can be any suitable computer system, such as computer system 300 of FIG. 3.

The chassis 402 of the computer system 400 can include an upper power supply receiving space 407 and a lower power supply receiving space 406. Upper power supply 409 and lower power supply 408 can be inserted into the upper power supply receiving space 407 and the lower power supply receiving space 406, respectively, in insertion direction 482. Upper power supply 409 is fully inserted into the upper power supply receiving space 407 in an incorrect orientation. Lower power supply 408 is fully inserted into the lower power supply receiving space 406 in a correct orientation.

In the correct orientation, the connector 464 of the lower PSU 408 is inserted into (e.g., received by and/or operatively coupled to) the receiving connector 474 of the lower power distribution board 468. Lower air baffle 422 is positioned above the receiving connector 474 of the lower power distribution board 468 at an end of the lower power supply receiving space 406. The ribs 432 of the lower air baffle 422 do not contact the body 462 of the lower PSU 408. A cable 450 is shown in the cable passthrough 426 of the lower air baffle 422. Cable 450 is depicted with eight cores for illustrative purposes only; any suitable cable can be used for cable 450. A compressible air seal 472 is positioned on an upper surface of the lower air baffle 422 to help reduce, minimize, or eliminate air leaks, thus encouraging all air flowing through the lower power supply receiving space 406 to be directed by the lower air baffle 422 into the airflow channel 410. In some cases, compressible air seal 472 can be sandwiched between the lower air baffle 422 and a structural frame of the chassis, lower power supply receiving space 406, and/or upper power supply receiving space 407.

Since the lower PSU 408 is fully inserted in the correct orientation, the external face 477 of the lower PSU 408 is flush with the chassis 402 and/or flush with the lower power supply receiving space 406, as indicated by line 476.

Upper PSU 409 is fully inserted into the upper power supply receiving space 407, but because it is inserted in the incorrect orientation, the connector 465 of the upper PSU 409 contacts the ribs 433 of the upper air baffle 423. In the incorrect orientation, the connector 465 of the upper PSU 409 cannot couple with the receiving connector 475 of the upper power distribution board 466.

Since the upper PSU 409 is fully inserted in the incorrect orientation, the external face 479 of the upper PSU 409 is not flush with the chassis 402 and/or flush with the upper power supply receiving space 407, as indicated by line 478. Distance 480 between line 476 (e.g., the flush line) and line 478 (e.g., the extended line) is the difference in insertion depth of the lower PSU 408 and upper PSU 409 due to the lower PSU 408 being inserted in the correct orientation and the upper PSU 409 being inserted in the incorrect orientation. Because upper PSU 409 appears to stick out of the upper power supply receiving space 407, it can be easily and quickly distinguished as being inserted in the incorrect orientation.

Upper air baffle 423 includes a cable passthrough 427 containing a cable 448, similar to cable 450. A compressible air seal 473 is positioned on an upper surface of the upper air baffle 423 to help reduce, minimize, or eliminate air leaks, thus encouraging all air flowing through the upper power supply receiving space 407 to be directed by the upper air baffle 423 into the airflow channel 410. In some cases, compressible air seal 473 can be sandwiched between the upper air baffle 423 and a top cover 460.

Figure 5:
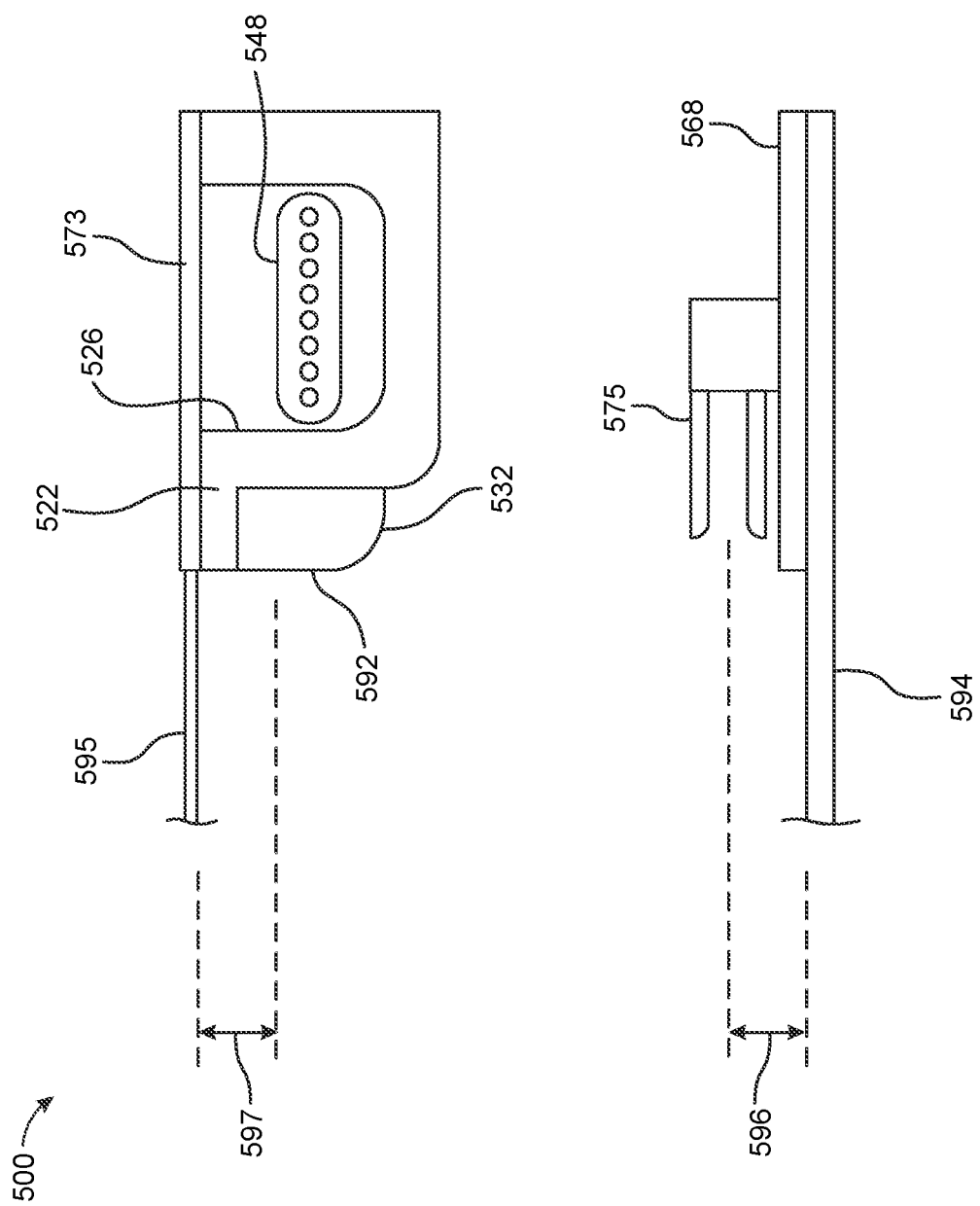
FIG. 5 is a close-up side cross-sectional view of a portion of a computer system taken along line A:A of FIG. 3 with no power supply unit inserted, according to certain aspects of the present disclosure.

FIG. 5 is a close-up side cross-sectional view of a portion of a computer system 500 taken along line A:A of FIG. 3 with no power supply unit inserted, according to certain aspects of the present disclosure. Computer system 500 can be any suitable computer system, such as computer system 400 of FIG. 4.

Air baffle 522 is positioned above a power distribution board 568. A cable passthrough 526 of the air baffle 522 can contain a cable 548, permitting the cable to pass laterally (e.g., in a direction into or out of the page in FIG. 5) through the air baffle 522. Cable 548 is depicted with eight cores for illustrative purposes only; any suitable cable can be used for cable 548. A compressible air seal 573 can cover the top of the cable passthrough 526.

The receiving connector 575 of the power distribution board 568 can be located a distance 596 away from a floor 594 of the power supply receiving space associated with the air baffle 522. This distance 596 can be approximately the same as the distance from the bottom edge of the PSU to the connector of the PSU. As used herein, measurements to a connector or a receiving connector can be to a plane centered along the height of the connector or receiving connector (e.g., a receiving space of the receiving connector for receiving the connector of the PSU).

The ribs 532 of the air baffle 522 can be positioned and/or can extend such that an impact surface 592 of the ribs 532 intersects a plane spaced apart from a ceiling 595 of the power supply receiving space associated with the air baffle 522 by a distance 597 that is the same as distance 596. In other words, a plane spaced apart from the ceiling 595 of the power supply receiving space by a distance 597 that is the same as distance 596 will intersect with the impact surface 592.

Thus, for any given PSU sized to fit within the power supply receiving space and engage the receiving connector 575 with its own connector when inserted in a correct orientation, that same PSU, if inserted in an incorrect orientation (e.g., rotate longitudinally by 180°), would have its own connector make contact with the impact surface 592 of the air baffle 522.

The impact surface 592 of the air baffle 522 can be positioned longitudinally (e.g., left and right as depicted in FIG. 5) within the chassis such that a PSU having its connector contact the impact surface 592 will extend out of the end of the chassis. In some cases, the impact surface 592 can be positioned such that the impact surface 592 is located opposite (e.g., longitudinally opposite) the receiving connector 575 from the airflow channel. In some cases, a plane formed by a PSU connector contacting the impact surface 592 can be positioned opposite the receiving connector from the airflow channel.

Figure 6:
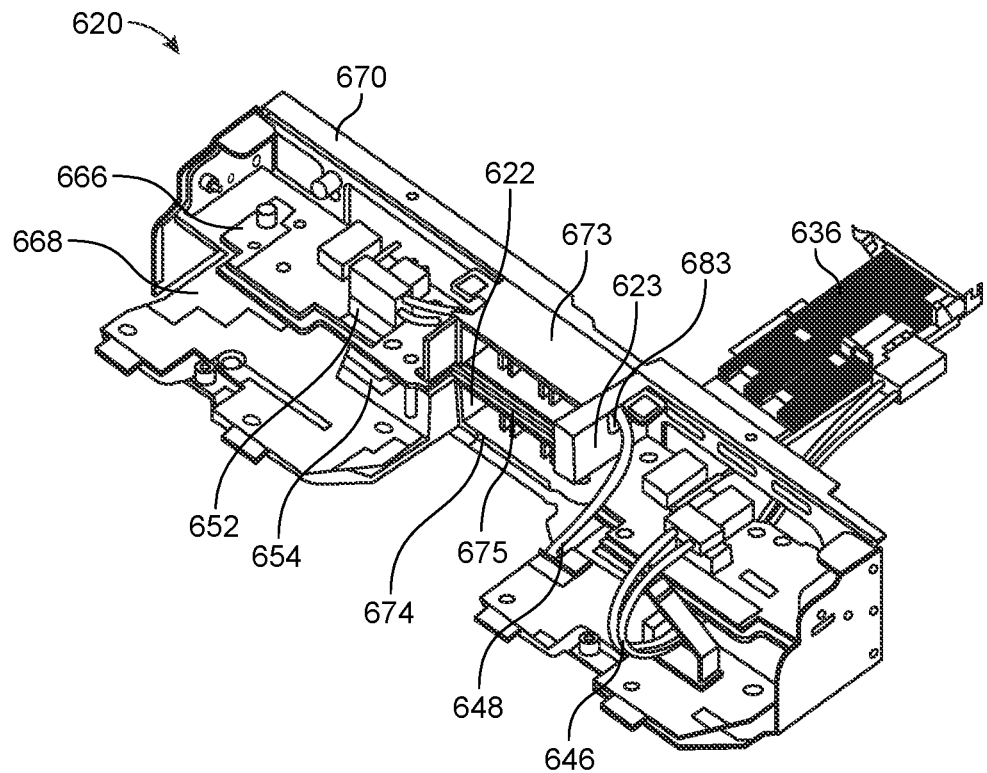
FIG. 6 is a front isometric projection of a portion of a power distribution group of a computer system, according to certain aspects of the present disclosure.

FIG. 6 is a front isometric projection of a portion of a power distribution group 620 of a computer system, according to certain aspects of the present disclosure. Power distribution group 620 can be any suitable power distribution group 620, such as power distribution group 320 of FIG. 3. The power distribution group 620 can include a lower power distribution board 668 positioned beneath an upper power distribution board 666. In some cases, the lower power distribution board 668 and the upper power distribution board 666 can be operatively coupled together to act as redundant backups for one another. In some cases, the power distribution group 620 can include a frame 670.

When a PSU is installed in the lower power distribution board 668 in a correct orientation, a connector of the PSU will be received by a receiving connector 674 of the lower power distribution board 668. Airflow through that PSU will pass through the lower air baffle 622, which will direct the airflow into an airflow channel of the chassis.

Likewise, when a PSU is installed in the upper power distribution board 666 in a correct orientation, a connector of the PSU will be received by a receiving connector 675 of the upper power distribution board 666. Airflow through that PSU will pass through the upper air baffle 623, which will direct the airflow into an airflow channel of the chassis.

A controller card 636 is depicted as being operatively coupled to the upper distribution board 666 and lower distribution board 668 via a set of cables, including a first cable 646, a second cable 648, and a third cable hidden by the upper power distribution board 666. The third cable can pass through a cable passthrough of the lower air baffle 622. In some cases, the third cable can couple to the lower power distribution board 668 at connector 654. The second cable 648 can pass through a cable passthrough 683 of the upper air baffle 622. In some cases, the second cable 648 can couple to the upper power distribution board 666 at connector 652. The first cable 646 may connect to the upper power distribution board 666 without passing through any of the lower air baffle 622 or upper air baffle 623, although that need not always be the case.

While the first cable 646, the second cable 648, and the third cable are shown as being connected to the upper power distribution board 666 or the lower power distribution board 668, that need not always be the case. In some cases, any such cable can directly connect to other components of the computing system, such as a storage drive.

As depicted in FIG. 6, a compressible air seal 673 is positioned on an upper surface of the upper air baffle 623. This compressible air seal 673 encloses the cable passthrough 683 such that removal of the compressible air seal 673 can permit access to the cable passthrough 683 from the upper surface of the upper air baffle 623. A similar compressible air seal may be used on the cable passthrough of the lower air baffle 622.

Figure 7:
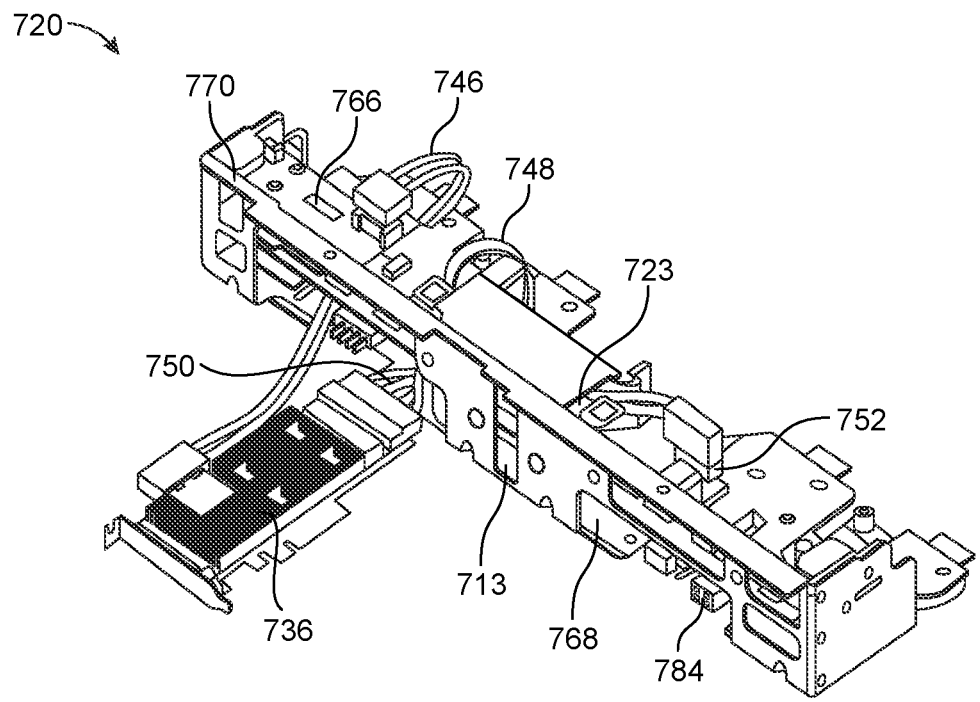
FIG. 7 is a rear isometric projection of a portion of a power distribution group of a computer system, according to certain aspects of the present disclosure.

FIG. 7 is a rear isometric projection of a portion of a power distribution group 720 of a computer system, according to certain aspects of the present disclosure. Power distribution group 720 can be any suitable power distribution group, such as power distribution group 620 of FIG. 6. The power distribution group 720 can include a lower power distribution board 768 positioned beneath an upper power distribution board 766.

A controller card 736 is depicted as being operatively coupled to the upper distribution board 766 and lower distribution board 768 via a set of cables, including first cable 746, second cable 748, and third cable 750. The third cable 750 can pass through a cable passthrough of a lower air baffle. In some cases, the third cable 750 can couple to the lower power distribution board 768 at a connector. The second cable 748 can pass through a cable passthrough of an upper air baffle 723. In some cases, the second cable 748 can couple to the upper power distribution board 766 at connector 752. The first cable 746 may connect to the upper power distribution board 766 without passing through any of the lower air baffle or upper air baffle 723, although that need not always be the case.

While the first cable 746, the second cable 748, and the third cable 750 are shown as being connected to the upper power distribution board 766 or the lower power distribution board 768, that need not always be the case. In some cases, any such cable can directly connect to other components of the computing system, such as a storage drive. However, as depicted in FIG. 7, first cable 746 and second cable 748 are coupled to the upper power distribution board 766, and third cable 750 is coupled to the lower power distribution board 768. Additional connectors 784 can be used to convey data signals (e.g., from any of the first cable 746, second cable 758, and third cable 750) to other components of the computer system. Additional connectors 784 can be on one or both of the upper power distribution board 766 and the lower power distribution board 768. In an example, a storage drive can be coupled, optionally via a drive board, to connector 784 of lower power distribution board 768, which can then be coupled to the controller card 736 via third cable 750, thus establishing an operative connection between the storage drive and the controller card 736.

When upper and lower PSUs are installed in correct orientations, airflow through the PSUs will be directed by upper air baffle 723 and lower air baffle, respectively, through airflow opening 713 in frame 770. Airflow opening 713 can direct airflow into the airflow channel of the chassis. In some cases, an airflow seal (e.g., a compressible air seal) can be used between the airflow channel and frame 770 to reduce, minimize, or eliminate any air leaks between the airflow channel and frame 770.

Figure 8:
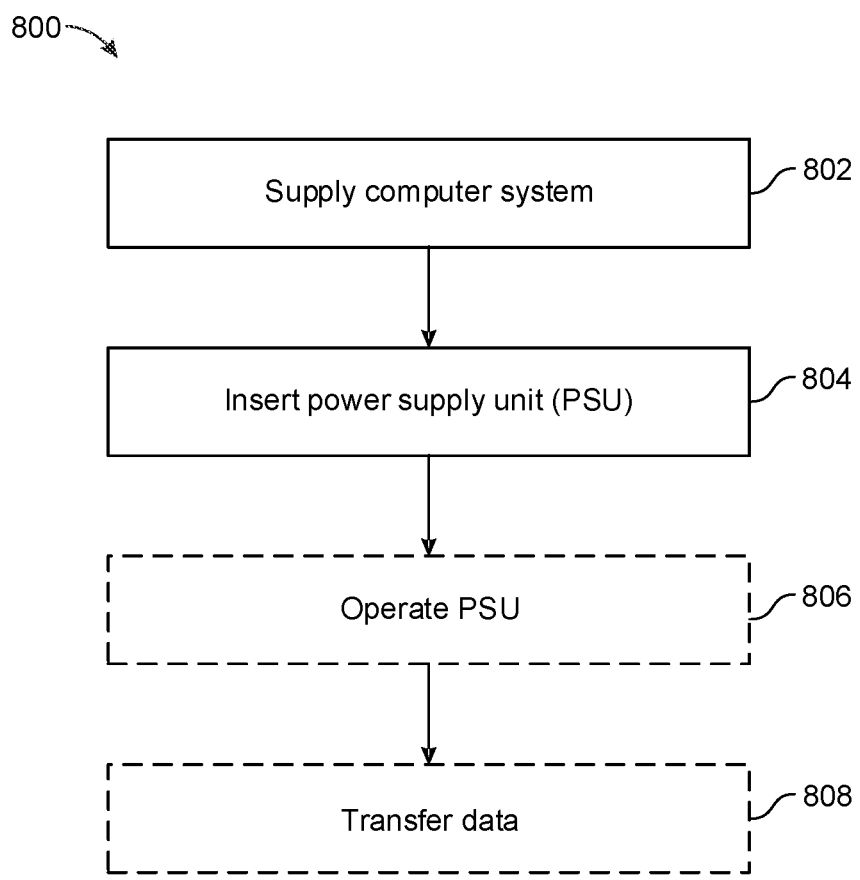
FIG. 8 is a flowchart depicting a process for using a computer system, according to certain aspects of the present disclosure.

FIG. 8 is a flowchart depicting a process 800 for using a computer system, according to certain aspects of the present disclosure. At block 802, a computer system is supplied. Any suitable computer system can be supplied, such as computer system 100 of FIG. 1 or computer system 300 of FIG. 3. In some cases, supplying the computer system at block 802 can include installing an air baffle between a power supply receiving space and an airflow channel, such as described herein. In some cases, supplying the computer system at block 802 can further include installing a cable through a cable passthrough of the air baffle.

At block 804, a PSU can be inserted into the power supply receiving space of the computer system. Inserting the power supply receiving space can include inserting the PSU in a correct orientation to establish a connection between the connector of the PSU and the receiving connector of a power distribution board of the computer system.

In some cases, inserting the PSU at block 804 can optionally include fully inserting the PSU in an incorrect orientation, identifying that the PSU is inserted in the incorrect orientation (e.g., based on identification of a distance that the PSU sticks out of the chassis, such as a distance between the chassis and a plane formed by an external face of the PSU), then removing and replacing the PSU in the correct orientation.

At optional block 806, the PSU can be operated. Operating the PSU can include supplying power to the PSU (e.g., from a mains power source) and causing the PSU to supply power to the computer system via the power distribution board. In some cases, operating the PSU can include powering a fan (e.g., a fan of the PSU or an additional fan) that causes air to flow through the PSU. Flowing air through the PSU can result in air being directed, by the air baffle, into an airflow channel (e.g., an airflow channel extending to an opposite end of the chassis from the power supply receiving space).

At optional block 808, data can be transferred within the computer system via one or more cables positioned in a cable passthrough of the air baffle. Transferring data via the one or more cables positioned in the cable passthrough of the air baffle can include transferring data between a first chassis space and a second chassis space separated from the first chassis space by the airflow channel.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the invention. Thus, the breadth and scope of the present invention should not be limited by any of the above described embodiments.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A baffle device for use in a computer system, the baffle device comprising:
    a baffle body having a first leg and a second leg connected by a cross-member, the cross-member extending from a first end of the baffle body to a second end of the baffle body;
    an airflow space defined by the first leg, the second leg, and the cross-member, wherein the airflow space is sized to receive a receiving connector for receiving a corresponding connector of a power supply unit (PSU) when the PSU is moved in an insertion direction to a first insertion depth while in a correct orientation;
    a cable passthrough located in the cross-member for receiving a cable, the cable passthrough extending between the first end of the baffle body and the second end of the baffle body; and
    at least one rib extending from the baffle body, wherein an impact surface of the at least one rib is positioned to contact the corresponding connector of the PSU when the PSU is moved in the insertion direction to a second insertion depth while in an incorrect orientation, wherein the first insertion depth is greater than the second insertion depth.

2. The baffle device of claim 1, wherein the cable passthrough is perpendicular to the insertion direction.

3. The baffle device of claim 1, further comprising a compressible air seal removably positioned on an upper surface of the baffle body.

4. The baffle device of claim 3, wherein the compressible air seal covers the cable passthrough such that removal of the compressible air seal permits access to the cable passthrough.

5. The baffle device of claim 1, wherein the cross-member includes a baffle surface for directing airflow impacting the baffle surface towards the airflow space, wherein the at least one rib extends from the baffle surface.

6. The baffle device of claim 1, wherein the baffle body is shaped such that a plane defined by the impact surface of the at least one rib is positioned opposite the receiving connector.

7. The baffle device of claim 1, wherein the baffle body is configured to rest upon a power distribution board containing the receiving connector.

8. The baffle device of claim 1, wherein the at least one rib is positioned such that a distance between the receiving connector and a bottom surface of a board containing the receiving connector is equal to a distance between an upper surface of the baffle body and a point on the impact surface.

9. A computer system, comprising:
    a chassis;
    a power supply receiving space located within the chassis, the power supply receiving space having a first end opposite a second end, the first end having an opening for receiving a power supply unit (PSU);
    a power distribution board positioned adjacent the second end of the power supply receiving space, the power distribution board having a receiving connector for receiving a corresponding connector of the PSU when the PSU is inserted into the power supply receiving space to a first insertion depth while the PSU is in a correct orientation;
    an airflow channel positioned in the chassis between a first chassis space and a second chassis space; and
    a baffle device positioned between the power supply receiving space and the airflow channel, the baffle device including a baffle surface for directing air passing through the power supply receiving space into the airflow channel, the baffle device further including a cable passthrough located in a cross-member for receiving a cable, the cable passthrough extending between a first end of the baffle device and a second end of the baffle device, the baffle device further having at least one rib extending from the baffle surface, wherein the at least one rib is positioned to contact the corresponding connector of the PSU when the PSU is inserted into the power supply receiving space to a second insertion depth while the PSU is in an incorrect orientation, wherein the first insertion depth is greater than the second insertion depth.

10. The computer system of claim 9, wherein the cable facilitates electrically coupling a first component in the first chassis space to a second component in the second chassis space.

11. The computer system of claim 9, wherein the cable couples to a data connector of the power distribution board.

12. The computer system of claim 9, wherein the cable passthrough is perpendicular to an insertion direction of the PSU when the PSU is inserted into the power supply receiving space.

13. The computer system of claim 9, further comprising a compressible air seal removably positioned on an upper surface of the baffle device.

14. The computer system of claim 13, wherein the compressible air seal covers the cable passthrough such that removal of the compressible air seal permits access to the cable passthrough.

15. The computer system of claim 9, wherein the baffle device is shaped such that the corresponding connector of the PSU contacts the at least one rib along a plane when the PSU is inserted in the incorrect orientation, and wherein the plane is positioned opposite the receiving connector from the airflow channel.

16. The computer system of claim 9, wherein the baffle device rests upon the power distribution board.

17. The computer system of claim 9, wherein the at least one rib includes an impact surface for contacting the corresponding connector of the PSU.

18. A method, comprising:
    supplying a computer system having:
        a chassis;
        a power supply receiving space located within the chassis;

a power distribution board positioned adjacent an internal end of the power supply receiving space, the power distribution board having a receiving connector;

an airflow channel positioned in the chassis between a first chassis space and a second chassis space; and a baffle device positioned between the power supply receiving space and the airflow channel, the baffle device including a baffle surface for directing air passing through the power supply receiving space into the airflow channel, the baffle device further including a cable passthrough located in a crossmember for receiving a cable, the cable passthrough extending between a first end of the baffle device and a second end of the baffle device, the baffle device further having at least one rib extending from the baffle surface;

inserting a power supply unit (PSU) into the power supply receiving space, the PSU having a connector positioned opposite an external face of the PSU, wherein insertion of the PSU in a correct orientation results in connection of the connector with the receiving connector when the PSU is inserted to a first insertion depth, wherein insertion of the PSU in an incorrect orientation results in contact between the connector and the at least one rib of the baffle device when the PSU is inserted to a second insertion depth, and wherein the first insertion depth is greater than the second insertion depth.

19. The method of claim 18, wherein the airflow channel separates the first chassis space and the second chassis space, wherein the computer system further includes a first component positioned in the first chassis space and a second component positioned in the second chassis space, the method further comprising:

operating the PSU, wherein operating the PSU comprises operating a fan associated with the PSU to pass air through the PSU, towards the baffle surface of the baffle device, and into the airflow channel, and wherein operating the PSU further comprises supplying power to the first component and the second component; and transferring data between the first component and the second component via the cable.

20. The method of claim 18, wherein inserting the PSU includes fully inserting the PSU in the incorrect orientation, the method further comprising identifying that the PSU is inserted in the incorrect orientation by identifying a distance between the chassis and a plane formed by the external face of the PSU.

* * * * *